(12) United States Patent
Furusawa

(10) Patent No.: US 6,908,796 B2
(45) Date of Patent: Jun. 21, 2005

(54) METHOD OF MANUFACTURING AN ELECTRO-OPTICAL DEVICE

(75) Inventor: Masahiro Furusawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/420,540

(22) Filed: Apr. 21, 2003

(65) Prior Publication Data

US 2003/0219934 A1 Nov. 27, 2003

(30) Foreign Application Priority Data

Apr. 22, 2002 (JP) ..................................... 2002-119965

(51) Int. Cl.$^7$ .............................................. H01L 21/00
(52) U.S. Cl. ........................... 438/149; 438/82; 438/30; 438/149; 438/151; 438/142; 257/40; 257/59; 315/169.1; 315/169.3; 349/110
(58) Field of Search ................................. 438/149, 158, 438/159, 509, 495, 500, 502; 257/59, 40; 349/56, 110; 315/169.1, 169.3

(56) References Cited

U.S. PATENT DOCUMENTS

| | | | | |
|---|---|---|---|---|
| 5,079,595 A | * | 1/1992 | Suzuki et al. ................. 257/40 |
| 5,296,043 A | * | 3/1994 | Kawakami et al. ......... 136/244 |
| 5,420,706 A | * | 5/1995 | Yamazaki et al. ........... 349/110 |
| 6,057,647 A | * | 5/2000 | Kurosawa et al. ........ 315/169.3 |
| 6,194,837 B1 | * | 2/2001 | Ozawa ..................... 315/169.1 |
| 2003/0166311 A1 | * | 9/2003 | Miyazawa .................... 438/82 |
| 2004/0005739 A1 | * | 1/2004 | Furusawa .................... 438/149 |

* cited by examiner

Primary Examiner—Matthew Smith
Assistant Examiner—Belur Keshavan
(74) Attorney, Agent, or Firm—Harness, Dickey & Pierce, P.L.C.

(57) ABSTRACT

A pixel portion 100 of a liquid crystal display device includes a thin film transistor T including a gate electrode 13, a gate insulating film 16, a channel region 18, and source/drain regions 22, a source line (data) 26 for supplying current to the thin film transistor T and a pixel electrode 24. In the formation of a pixel circuit 100, a gate electrode 13, a gate insulating film 16, and the channel region 18 are firstly formed on a glass substrate 10. After the formation of the channel region 18 and the like, a polyimide film 20 surrounding the peripheries of the regions to be provide with the source/drain regions 22, the pixel electrode 24 and the source line 26 on a glass substrate 10 is formed. The regions surrounded with the wall of the polyimide film 20 are applied with a liquid material and subjected to a thermal treatment, thereby forming the element of the source/drain regions 22 and the like.

11 Claims, 11 Drawing Sheets

SECTION A-A'

(a)

(b)

SECTION A-A'

(a)

(b)

SECTION B-B'

(a)

(b)

SECTION C-C'

(a)

(b)

SECTION D-D'

(a)

(b)

SECTION E-E'

(a)

(b)

SECTION F-F'

(a)

(b)

SECTION G-G'

METHOD OF MANUFACTURING AN ELECTRO-OPTICAL DEVICE

BACKGROUND OF THE INVENTION

1. Technical Field of the Invention

The present invention relates to a method of manufacturing a device (for example, a semiconductor device) comprising thin film elements such as thin film transistors, and a device manufactured by the method.

2. Description of the Related Art

A liquid crystal display device has features of being thin, lightweight, and low power consuming, and thus it is used for various electronic apparatuses such as in personal computers, mobile phones, digital still cameras, or liquid crystal televisions.

The liquid crystal display device is provided with pixel portions using thin film transistors. As the thin film transistor constituting the pixel portion, the inversely staggered type (or bottom gate type) structure constructed by forming a gate electrode on a substrate and laminating a semiconductor layer such as a channel region or a source/drain region or an insulating layer etc. thereon is being widely employed.

A pixel circuit of the liquid crystal display device is constructed by combining a scanning line for supplying a signal to the thin film transistor and the gate electrode, a data line for supplying a signal to one side of the source/drain region, or a pixel electrode connected to the other side of the source/drain region for applying voltage to a liquid crystal layer, etc.

The device such as the aforementioned liquid crystal display device is generally manufactured by repeating a process for forming a thin film by means of the vapor phase deposition method (that is, the vacuum process) such as the CVD method or the sputtering method and removing (etching) the unnecessary portion of the thin film by means of the photolithography method.

However, in this conventional manufacturing method, there are problems that (1) since the process comprising the film formation and the etching is repeated many times, the manufacturing time is long, (2) since much of the formed thin film is removed, the utilization efficiency of raw material is not good, and (3) since waste such as the etching solution is excessively generated, the processing cost thereof is increased. These disadvantages make it difficult to reduce the manufacturing cost in the conventional manufacturing method.

These problems become more remarkable as the glass substrate to be a basic material becomes larger with an increase in screen size of the liquid crystal display device. Further, these problems are not limited to the method of manufacturing the liquid crystal display device but common to the method of manufacturing various devices comprising the thin film devices such as the thin film transistors.

The present invention is made in view of the above problems and an object of the present invention is to provide a method of manufacturing a device making it possible to reduce the manufacturing cost.

Another object of the present invention is to provide a device making it possible to realize lower cost.

SUMMARY

In order to accomplish the above objects, the present invention provides a method of manufacturing a device, at least some elements of the device are film-formed using liquid materials, the method comprising: a process of allocating on a substrate regions for a plurality of elements constituting the device; a partition wall formation process for forming the partition wall surrounding the peripheries of at least the regions for the elements to be formed using liquid materials, among the regions for the plurality of elements; and a film formation process of applying the liquid material to the regions surrounded with the partition wall and performing a thermal treatment, thereby forming a film.

Since the elements constituting the device are formed by forming the partition wall surrounding the peripheries of some regions for elements of the device and then applying the liquid material to the regions surrounded with the partition wall to form a thin film, the number of the execution steps of the conventional process for forming the film by a combination of the vapor phase deposition method such as the CVD method or the sputtering method and the photolithography method can be reduced to simplify the manufacturing process and it is possible to reduce the manufacturing time. Further, since the partition wall is provided, it is possible to minimize the range to which the liquid material is applied and as a result, the utilization efficiency of raw material is good. Furthermore, since the number of etching processes is reduced, it is possible to reduce the amount of waste and thus to reduce the processing cost. Therefore, it is possible to reduce the manufacturing cost. These advantages of the present invention become more remarkable with an increase in the scale of the device to be manufactured.

The aforementioned device is considered to comprise a thin film transistor and wiring, the thin film transistor being formed by sequentially laminating, in order, a gate electrode, a gate insulating film, a channel region, and source/drain regions on the substrate, and the wiring supplying current to the thin film transistor. In this case, in the aforementioned partition wall formation process, after the gate electrode, the gate insulating film, and the channel region are formed on the substrate, the partition wall preferably is formed to surround the periphery of the first region where the source/drain regions are to be formed and also to simultaneously surround the second region where the wiring is to be formed, and in the film formation process, a doped semiconductor film for forming the source/drain regions preferably is formed in the first region and simultaneously, a conductive film for forming the wiring is formed in the second region. Therefore, it is possible to reduce the manufacturing cost when manufacturing the device comprising the thin film transistor and the wiring.

Furthermore, the present invention provides a method of manufacturing a device, at least some elements of which are film-formed using liquid materials, the method comprising: a process of allocating on a substrate regions for a plurality of elements constituting the device, a partition wall formation process for forming the partition wall surrounding each of the peripheries of the regions for the plurality of elements to be formed using a liquid material among the plurality of regions for elements, the first film formation process by applying the first liquid material to the regions for the first group of elements among the plurality of the regions surrounded with the partition wall and performing a thermal treatment, thereby forming a film, and the second film formation process by applying the second liquid material to the regions for the second group of elements among the plurality of the regions surrounded with the partition wall and performing a thermal treatment, thereby forming a film.

Since the elements constituting the device are formed by forming the partition wall surrounding the peripheries of some regions for elements of the device and then applying the plurality of the liquid material to the plurality of regions surrounded with the partition wall to form various types of thin films, the number of execution steps of the conventional process for forming the film by a combination of the vapor phase deposition method such as the CVD method or the sputtering method and the photolithography method can be reduced to simplify the manufacturing process and it is possible to reduce the manufacturing time. More particularly, in the conventional process, it is necessary to repeat the process many times in order to obtain the film formation of various types of thin films in desired shape, but in the present invention, the film formation of various types of thin films can be formed without such a process. Therefore, it is possible to simplify the manufacturing process greatly. Further, since the partition wall is provided, it is possible to minimize the range to which the liquid material is applied and as a result, the utilization efficiency of the raw material is good. Furthermore, since the number of the etching processes is reduced, it is possible to reduce the amount of waste. Therefore, it is possible to reduce the manufacturing cost of device. These advantages of the present invention become more remarkable with an increase in the scale of the device to be manufactured.

The aforementioned device is considered to comprise a thin film transistor and wiring, the thin film transistor being formed by sequentially laminating, in order, a gate electrode, a gate insulating film, a channel region, and source/drain regions on the substrate, and the wiring supplying current to the thin film transistor. In this case, in the aforementioned partition wall formation process, it is preferable that after the gate electrode, the gate insulating film, and the channel region and source/drain regions are formed on the substrate, the partition wall is formed to surround the periphery of the first region where source/drain regions are to be formed and simultaneously the periphery of the second region where the wiring is to be formed. In the first film formation process, it is preferable that a doped semiconductor film for forming the source/drain regions is formed in the first region. In addition, in the second film formation process, it is preferable that a conductive film for forming the wiring is formed in the second region. By doing so, it is possible to reduce the manufacturing cost when manufacturing the device comprising the thin film transistor and the wiring.

It is preferable that the aforementioned source/drain region is a doped silicon film formed using liquid materials containing a silicon compound and a dopant source. For example, the silicon compound includes a silane of high order such as cyclopentasilane ($Si_5H_{10}$) having one or more ring-shaped structures with ultraviolet ray irradiated for photo-polymerization. Further, the dopant source may include a material containing a Group V element (for example, phosphorus) or a Group III element (for example, boron). Since the liquid material containing such a silicon compound and a dopant source is used, it is possible to form a heavily doped silicon film easily.

It is preferable that the aforementioned wiring is a conductive film formed using liquid materials containing conductive fine particles. Here, the conductive fine particles may be metal fine particles containing any element selected from gold, silver, copper, palladium, and nickel or fine particles of conductive polymer or superconductor, but the metal fine particles are more preferable. Since a liquid material containing such conductive fine particles are used, it is possible to form a conductive film having high quality easily. It is preferable that the wiring formed with the conductive film is used for a signal line connected to the source/drain regions of a thin film transistor.

In case that the aforementioned device has a predetermined function and further comprises a functional region connected to the thin film transistor, it is preferable that in the aforementioned partition wall formation process, a partition wall is formed to surround a third region for forming the functional region in addition to the first and second regions, and in the film formation process, a thin film for forming the functional region is formed in addition to the doped semiconductor film and conductive film. The functional region includes a pixel electrode constituting a pixel portion of an electro-optical device.

Furthermore, in case that the device has a predetermined function and further comprises a functional region connected to the thin film transistor, it is preferable that in the aforementioned partition wall formation process, a partition wall is formed to surround a third region for forming the functional region in addition to the first and second regions, and the method further comprises a third film formation process for applying a third liquid material to a third region and performing a thermal treatment, thereby forming a thin film to form the functional region. The functional region includes a pixel electrode constituting a pixel portion of an electro-optical device.

The thin film forming functional regions such as an pixel electrode is provided with the partition wall and applied with a liquid material so that it is possible to reduce manufacturing time, enhance utilization efficiency of raw material, and reduce the amount of waste due to further simplifying the manufacturing process. Therefore, it is possible to further reduce the manufacturing cost.

In the aforementioned partition wall formation process, it is preferable that an insulating film is formed on the substrate and an opening is formed in the insulating film to expose regions for elements using the liquid material, thereby forming a partition wall. By doing so, the partition wall surrounding the peripheries of the regions of the plurality of elements using the liquid material can be formed simultaneously in the same process.

It is preferable that the insulating film forming a partition wall is a polyimide film. By doing so, it is possible to form the partition wall easily. In the particular case of using a photosensitive polyimide solvent, after the substrate is applied with the polyimide solvent and dried, the region corresponding to an opening is exposed and developed to be removed (in the case that the polyimide solvent is a positive type), and then the region is baked so that it is possible to form the partition wall easily.

It is preferable that the aforementioned liquid material (including the first to third liquid materials) is filled by means of a droplet ejection method. Therefore, it is possible to fill with the liquid material rapidly under the control of drop position and drop quantity. Further, the channel region is formed by ejecting a fourth liquid material containing a silicon compound on the gate insulating film by means of a droplet ejection method. By doing so, it is possible to further simplify the manufacturing process.

It is preferable that the thermal treatment in the second film formation process and the thermal treatment in the third film formation process are simultaneously performed. By doing so, it is possible to further simplify the manufacturing process.

Further, since the second film formation process and the third film formation process are performed to the separate sites, the order of the process can be changed in consideration of the temperatures of baking processes and the conditions of the other processes if it is possible. In other words, the third film formation process can be performed before the second film formation.

It is also preferable that the partition wall formation process further comprises a process of making a surface of the partition wall be lyophobic with respect to the liquid material.

In the second film formation process, it is preferable that the second liquid material or the third liquid material is ejected between the source/drain regions and the wiring so as to form a connecting portion for electrically connecting the source/drain regions and the wiring. Since the connecting portion is formed at the same time of formation of the wiring, it is possible to further simplify the manufacturing process.

In the third film formation process, it is preferable that the second liquid material or the third liquid material is ejected between the source/drain regions and the functional region so as to form a connecting portion for electrically connecting the source/drain regions and the functional region. Since the connecting portion is formed at the same time as the formation of the functional region, it is possible to further simplify the manufacturing process.

Further, a device of the present invention is manufactured according to any of the aforementioned methods. By doing so, it is possible to reduce the manufacturing cost for the device.

More particularly, a device of the present invention has the constitution described below. In other words, present invention provides a device comprising a plurality of elements formed on a substrate, in which a partition wall is provided to surround the peripheries of at least some elements of the plurality of elements.

Further, in the case that the device comprises a thin film transistor formed by sequentially laminating, in order, a gate electrode, a gate insulating film, a channel region, and source/drain regions on the substrate, and the wiring supplying current to the thin film transistor, it is preferable that the aforementioned partition wall is provided to surround the peripheries of at least the source/drain regions and the wiring. Furthermore, it is preferable that the partition wall is a polyimide film.

In the case that the device further comprises a functional region connected to the thin film transistor for realizing a predetermined function, it is preferable that the partition wall is provided to surround each of the peripheries of source/drain regions, the wiring and the functional region. It is preferable that the functional region is a pixel electrode constituting a pixel portion of the electro-optical device.

It is preferable that the source/drain regions region are a silicon film formed using liquid materials containing a silicon compound and a dopant source.

It is preferable that the aforementioned wiring is a conductive film formed using liquid materials containing conductive fine particles. Furthermore, it is preferable that the conductive fine particles are metal fine particles containing any element selected from gold, silver, copper, palladium, and nickel.

Further, the present invention may be an electro-optical device (including a liquid crystal display device, an organic electroluminescent display device and the like) comprising the aforementioned device. More particularly, it is preferable that the electro-optical device is a liquid crystal display device.

Furthermore, the present invention provides an electronic apparatus comprising the aforementioned electro-optical device. The electronic apparatus includes a personal computer, a liquid crystal T.V. and the like.

DETAILED DESCRIPTION

Now, a liquid crystal display device according to the first embodiment of the present invention and a method of manufacturing thereof will be described with reference to the appended drawings.

In the present invention, the droplet ejection method is the method of forming the desired pattern, including the ejected material, by ejecting droplets to a desired region and may be referred to as the inkjet method. In this case, the droplet to be ejected is not so-called ink used for printing but a liquid material containing materials constituting the device, the materials include materials serving as, for example, the conductive material or insulating material constituting the device. Further, the droplet ejection is not limited to ejection by atomization but includes continuous ejection of the liquid material drop by drop.

Figure 1:
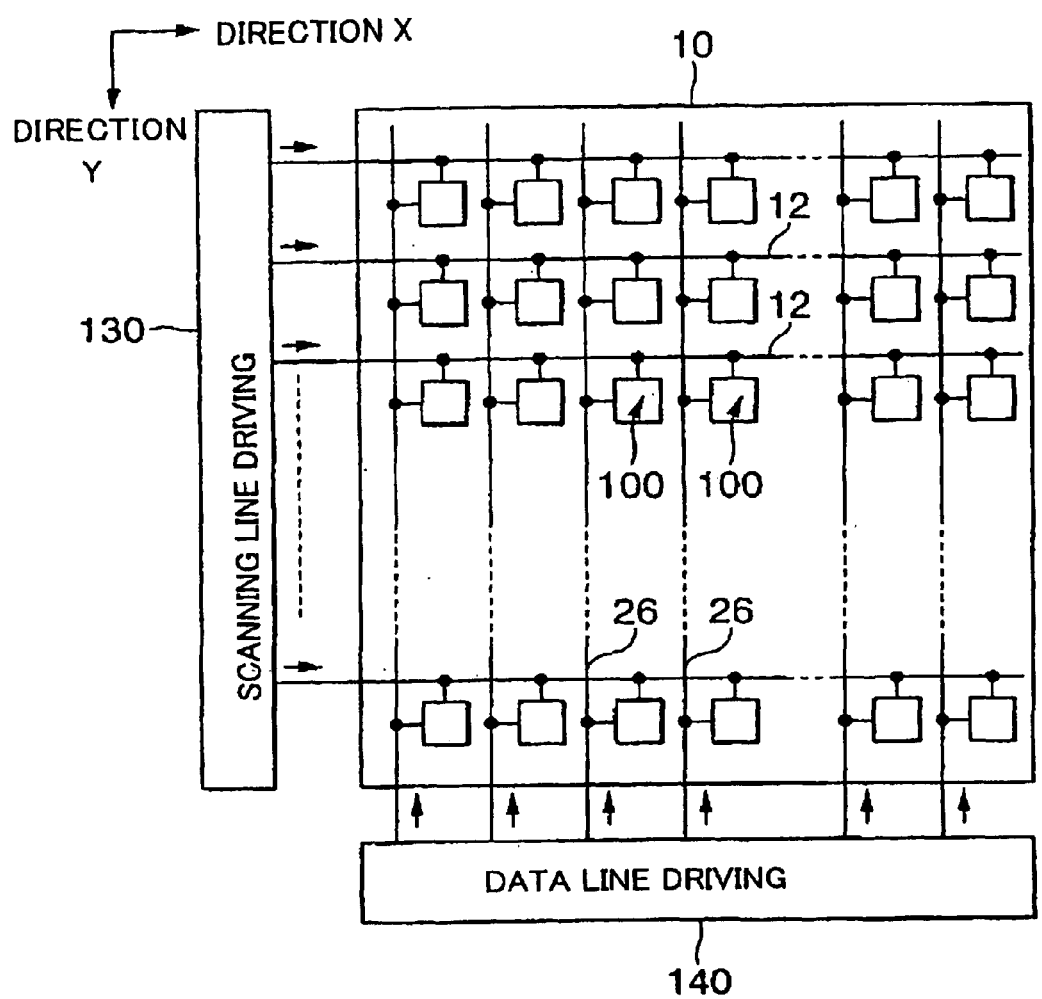
FIG. 1 is a view schematically illustrating configuration of a liquid crystal display device according to an embodiment of the present invention.

FIG. 1 schematically illustrates the configuration of the liquid crystal display device of this embodiment. The liquid crystal display device of this embodiment is configured in which an element substrate (array substrate) and a counter substrate are bonded with a constant gap maintained between each other and the liquid material is sandwiched between this gap. As the element substrate and the counter substrate, substrates made of a plate-shaped insulating member comprising glass, quartz or plastics can be used and in this embodiment, the glass substrate is used.

As shown in FIG. 1, a plurality of scanning lines 12 are formed on a glass substrate 10 to extend in an X (row)

direction and these scanning lines 12 are connected to a scanning line driving circuit 130. Further, a plurality of data lines 26 are formed on the glass substrate 10 to extend in a Y (column) direction and these data lines 26 are connected to a data line driving circuit 140. Pixel portions 100 are formed to correspond to each of the intersections of the scanning lines 12 and the data lines 26 and are arranged in a matrix shape. Furthermore, the scanning line driving circuit 130 or the data line driving circuit 140 may be formed on the glass substrate 10.

Figure 2:
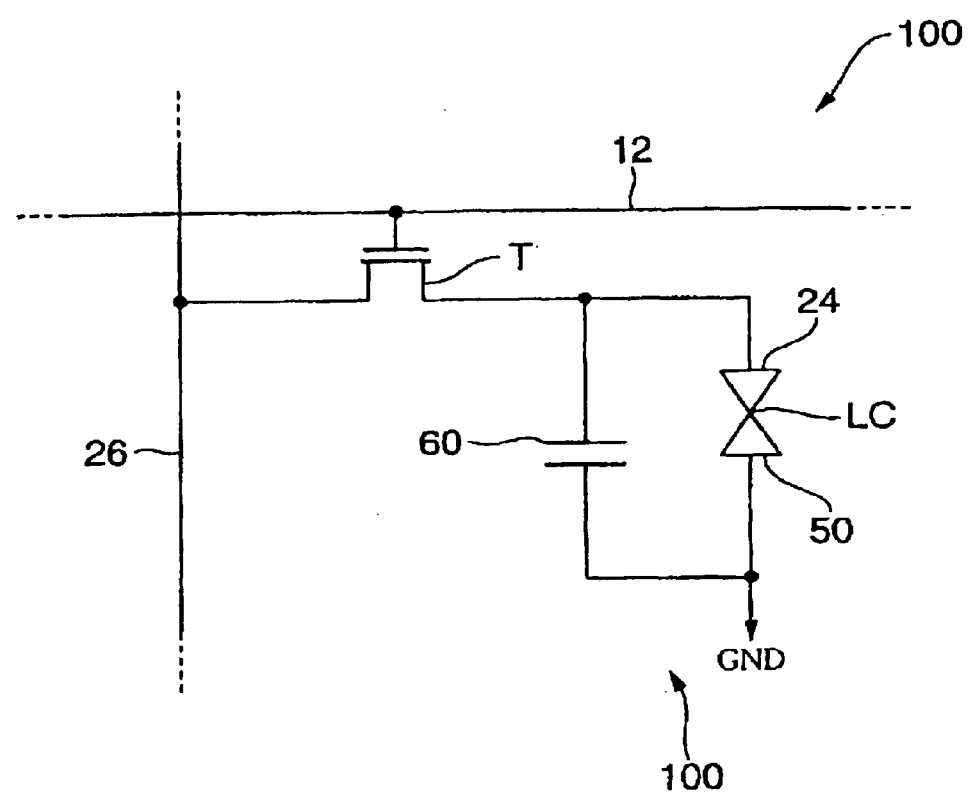
FIG. 2 is a view illustrating a specific example of configuration of a pixel portion.

FIG. 2 illustrates a specific example of the configuration of the pixel portions 100. The pixel portion 100 shown in FIG. 2 is configured such that a gate of a thin film transistor T is connected to the scanning line 12, a source thereof is connected to the data line 26, a drain thereof is connected to a pixel electrode 24, respectively and a liquid crystal LC as an electro-optical material is sandwiched between the pixel electrode 24 and a counter electrode 50. Furthermore, a storage capacitor 60 is formed between the pixel electrode 24 and a ground potential GND. This storage capacitor 60 is provided for almost constantly maintaining the applied voltage for a necessary time after voltage is applied to the pixel electrode 24 through the thin film transistor T. The counter electrode 50 is a transparent electrode common to the respective pixels, which is formed on one surface of the counter substrate so as to oppose the pixel electrode 24.

Figure 3:
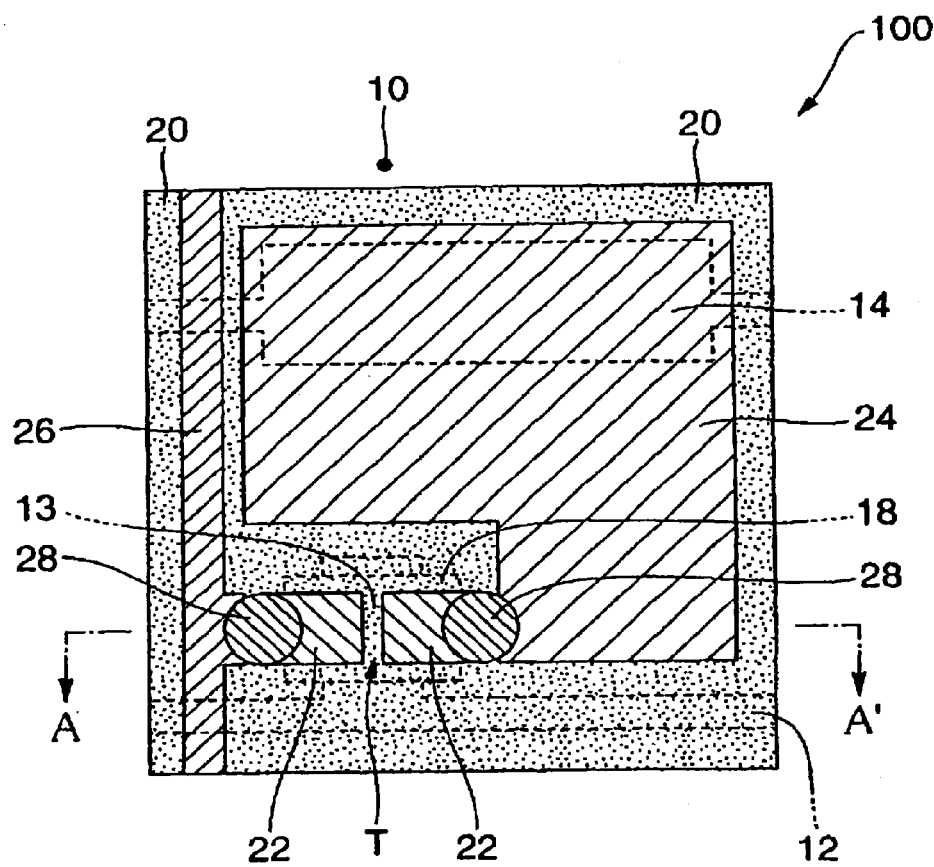
FIGS. 3a and 3b are views illustrating a specific structure of a pixel portion.
Figure 3:
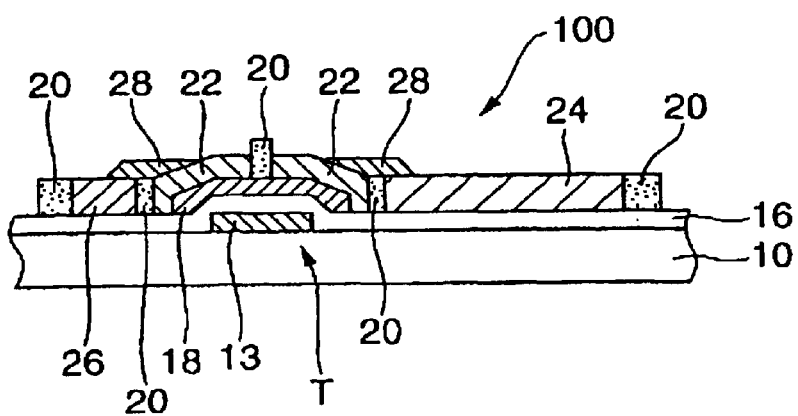

Next, a specific structure of the pixel portion 100 shown in FIG. 2 will be described. FIG. 3 illustrates a specific structure of the pixel portion in the liquid crystal display device of this embodiment. FIG. 3(a) is a plan view considering one pixel portion 100 and FIG. 3(b) is a cross-sectional view taken along a line A–A' shown in FIG. 3(a).

As shown in FIG. 3, the thin film transistor T of this embodiment has a so-called inversely staggered structure and comprises a gate electrode 13 formed on the glass substrate 10, a gate insulating film 16 formed on the gate electrode 13, a channel region 18 formed on the gate insulating film 16 and source/drain regions 22 formed on the channel region 18.

Further, the pixel circuit 100 to drive the pixel of the liquid crystal display device comprises the aforementioned thin film transistor T, a scanning line (gate line) 12, a capacitor line 14, a pixel electrode 24 and a data line (source line) 26, respectively. Furthermore, in this embodiment, the gate electrode 13 of the thin film transistor T is formed integrally with the gate line 12. The formation method of the gate line 12 and the gate electrode 13 will be described later.

One source/drain region 22 is connected to the pixel electrode 24 through a connecting portion 28. The pixel electrode 24 applies voltage to the liquid crystal LC. Further, the other source/drain region 22 is connected to the data line 26 through a connecting portion 29. The capacitor line 14 forms the aforementioned storage capacitor for more stably maintaining the charges in the liquid crystal layer and is formed under the pixel electrode 24.

Furthermore, a wall (bank) made of a polyimide film 20 is formed to surround the respective peripheries of the source/drain regions 22, the pixel electrode 24 and the data line 26. This polyimide film 20 is used in forming the source/drain regions 22, the pixel electrode 24 and the data line 26, respectively and details thereof will be described later.

The array substrate is constructed by forming the pixel portions 100 on the glass substrate 10 in a matrix shape. Then, by performing surface processing such as formation of oriented film to the array substrate and the counter substrate which is provided with the color filter (CF), bonding both, injecting the liquid crystal material between the array substrate and the counter substrate and providing the driving circuit and the backlight etc., the liquid crystal display device is formed. A specific example of the liquid crystal display device will be described later.

Next, a method of manufacturing the thin film transistor of this embodiment and the pixel circuit comprising the thin film transistor will be described in detail. FIGS. 4 to 9 are explanatory views illustrating the manufacturing method of this embodiment.

Process for Forming Gate Line, Gate Electrode and Capacitor Line

Figure 4:
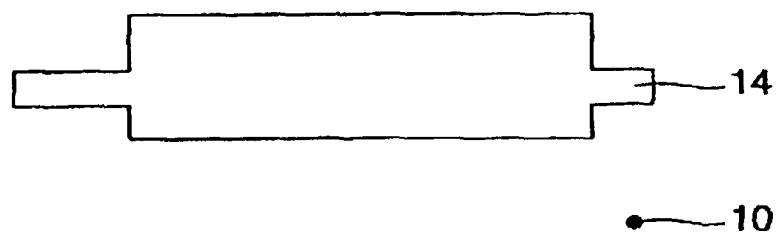
FIGS. 4a and 4b are views illustrating a manufacturing method according to an embodiment of the present invention.
Figure 4:
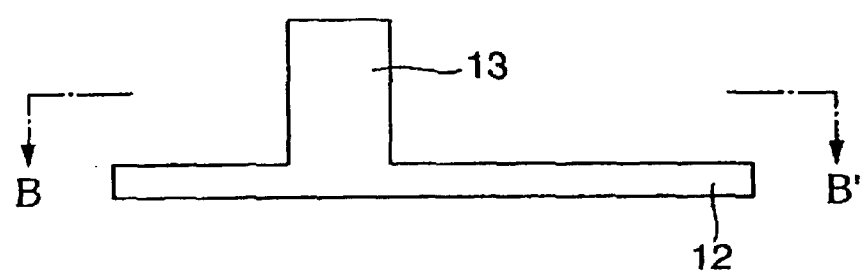
Figure 4:
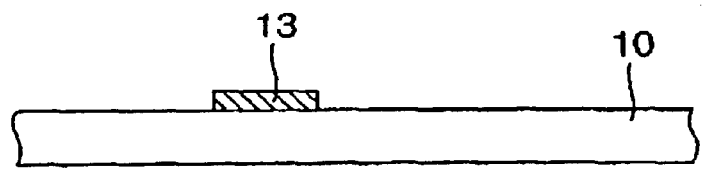

FIG. 4 illustrates the processes of forming the gate line, the gate electrode and the capacitor line. FIG. 4(a) is a plan view of the glass substrate 10 seen from the upper side and FIG. 4(b) is a cross-sectional view taken along a line B–B' shown in FIG. 4(a).

As shown in FIG. 4, the gate line 12 and the gate electrode 13 are formed in a bundle and the capacitor line 14 is formed predetermined positions on the glass substrate 10, by using the droplet ejection method. Specifically, the upper surface of the glass substrate 10 is made to be lyophobic to some extent. Next, a solution containing conductive fine particles is ejected to the upper surface of the glass substrate 10 to delineate each of the gate line 12, the gate electrode 13 and the capacitor line 14. Thereafter, the glass substrate 10 applied with the solution is subjected to the thermal treatment and as a result, the gate line 12, the gate electrode 13 and the capacitor line 14 are formed.

Here, as with the conductive fine particles, metal fine particles containing one of gold, silver, copper, palladium and nickel or fine particles of conductive polymer or super-semiconductor can be considered. In this embodiment, the solution formed by dispersing these conductive fine particles in an organic solvent is employed. In order to disperse the fine particles, the surfaces of the fine particles may be coated with organic materials. Furthermore, in adhering the materials to the glass substrate 10, it is preferable that diameters of the fine particles are 0.1 $\mu$m or less for facilitating the dispersion into the solvent and applying the droplet ejection method.

For example, if using a solution formed by diluting a paste (using α-terpineol as the dispersing solvent) containing silver fine particles having a diameter of about 0.01 $\mu$m with toluene to make its viscosity be about 8 cP, it is possible to form the gate line 12 and the gate electrode 13 having a width of 20 $\mu$m, a thickness of 0.5 $\mu$m and a resistivity of 2 $\mu\Omega$cm.

Further, the ejection of solution may be carried out after forming the wall (bank) surrounding the forming regions of the gate line 12, or the ejection of solution may be carried out after performing a lyophilic processing to the forming regions of the gate line 12 in addition to performing a lyophobic processing to the upper surface of the glass substrate 10. By doing so, diffusion of the solution applied to the forming region of the gate line 12 can be suppressed, so that the shape of the gate line 12 can be formed more accurately.

Furthermore, the gate line 12 may be formed by forming a film on the whole upper surface of the glass substrate 10 by means of a vapor phase deposition method such as the typical sputtering method, a plasma chemical vapor deposition (PECVD) method or a low pressure chemical vapor deposition (LPCVD) method and then patterning the film.

Process for Forming Gate Insulating Film and Amorphous Silicon Film

Figure 5:
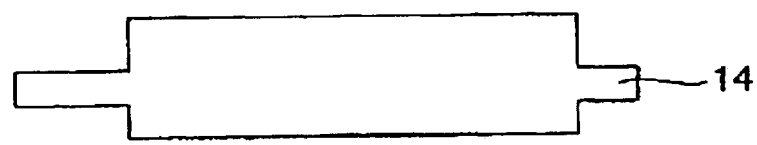
FIGS. 5a and 5b are views illustrating a manufacturing method according to an embodiment of the present invention.
Figure 5:
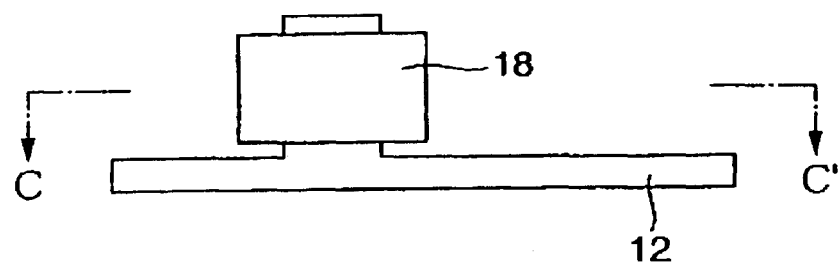
Figure 5:
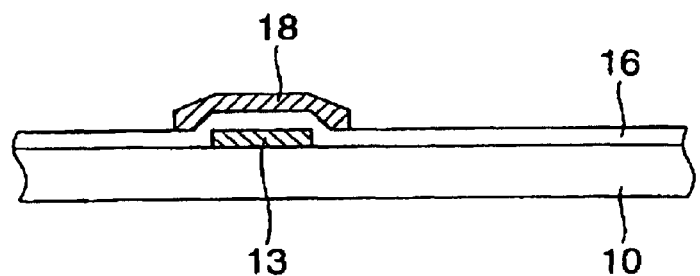

FIG. 5 illustrates the processes for forming the gate insulating film and the amorphous silicon film. FIG. 5(a) is a plan view of the glass substrate 10 seen from the upper side and FIG. 5(b) is a cross-sectional view taken along a line C–C' shown in FIG. 5(a).

As shown in FIG. 5, the gate insulating film 16 is formed on the whole upper surface of the glass substrate 10 to cover the glass substrate 10, the gate line 12, the gate electrode 13 and the capacitor line 14, respectively. It is preferable that the silicon nitride (SiNx) film is formed as the gate insulating film 16 by using the PECVD method. Further, the gate insulating film 16 may be formed as a bilayer structured film deposited to overlay the silicon nitride and the silicon oxide ($SiO_2$). In this case, it is preferable that the film formation is carried out using a so-called continuous CVD method which continuously forms plural types of thin films by changing the reaction gas during the film formation in the CVD method.

Next, the channel region 18 made of the amorphous silicon film is formed at a predetermined position on the gate insulating film 16. Specifically, the channel region 18 is formed in an island shape (isolatedly) on the gate electrode 13 as shown in FIG. 5(a), by forming the amorphous silicon film on the whole upper surface of the glass substrate 10 by means of a vapor phase deposition method such as the PECVD method and then patterning the film into a desired shape. Furthermore, it is preferable that the formation of the amorphous silicon film on the glass substrate 10 is carried out successively after the formation of the aforementioned gate insulating film 16 by using the continuous CVD method.

Process for Forming Bank Made of Polyimide Film

Figure 6:
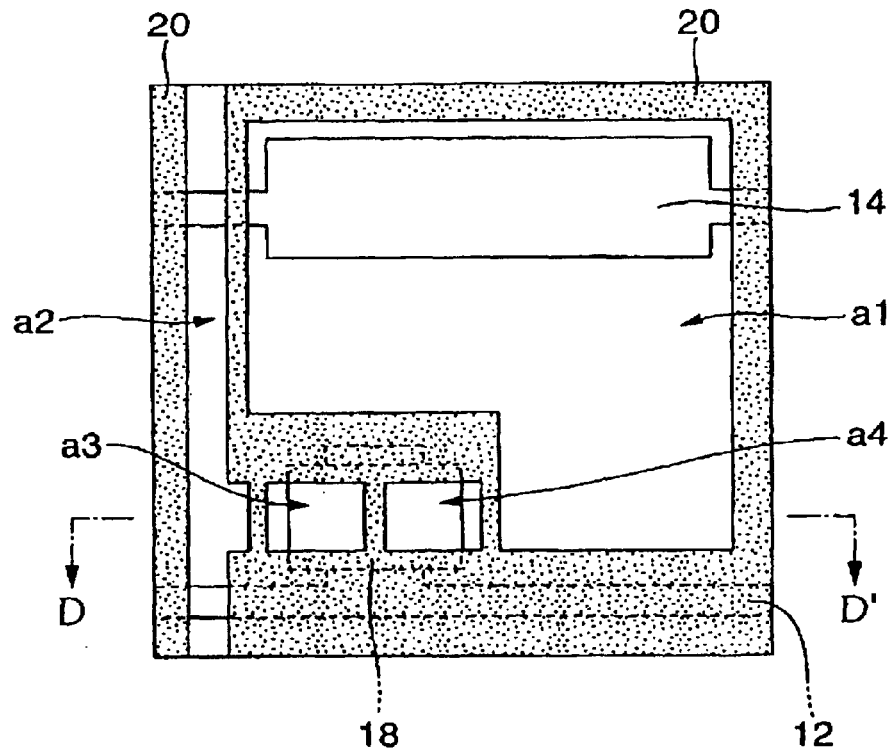
FIGS. 6a and 6b are views illustrating a manufacturing method according to an embodiment of the present invention.
Figure 6:
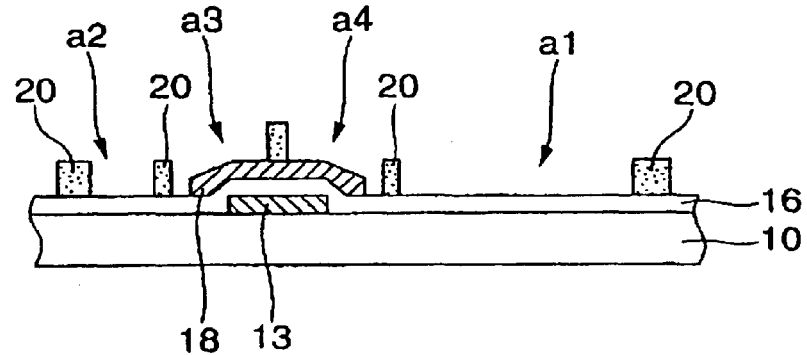

FIG. 6 illustrates the process for forming the bank (wall) made of polyimide film. FIG. 6(a) is a plan view of the glass substrate 10 seen from the upper side and FIG. 6(b) is a cross-sectional view taken along a line D–D' shown in FIG. 6(a).

As shown in FIG. 6, a polyimide film 20 having predetermined shapes of openings a1, a2, a3, a4 is formed on the upper surface of the glass substrate 10. Specifically, the opening a1 provided in the polyimide film 20 is formed to expose the region in which the pixel electrode 24 should be formed in the subsequent process. Thereby, the bank made of the polyimide film 20 is formed on the periphery of the forming region of the pixel electrode 24.

The opening a2 is formed to expose the region where the data line 26 is to be formed in the subsequent process. Thereby, the bank made of the polyimide film 20 is formed on the periphery of the forming region of the data line 26. Similarly, the openings a3, a4 are formed to expose the regions where the source/drain regions 22 of the thin film transistor T is to be formed in the subsequent process. Accordingly, the banks made of the polyimide film 20 are formed on the peripheries of the forming regions of the source/drain regions 22.

This polyimide film 20 may be formed by applying the photosensitive polyimide solvent to the whole upper surface of the glass substrate 10, drying it, removing (when the polyimide solvent is positive type) the respective regions corresponding to the openings a1 to a4 through exposure and development thereof, and then baking it at a temperature of 300° C. to 400° C. Furthermore, it is preferable that the polyimide film 20 is formed to be 0.5 to 10 $\mu$m thick.

Process for Forming Source/Drain Regions

Figure 7:
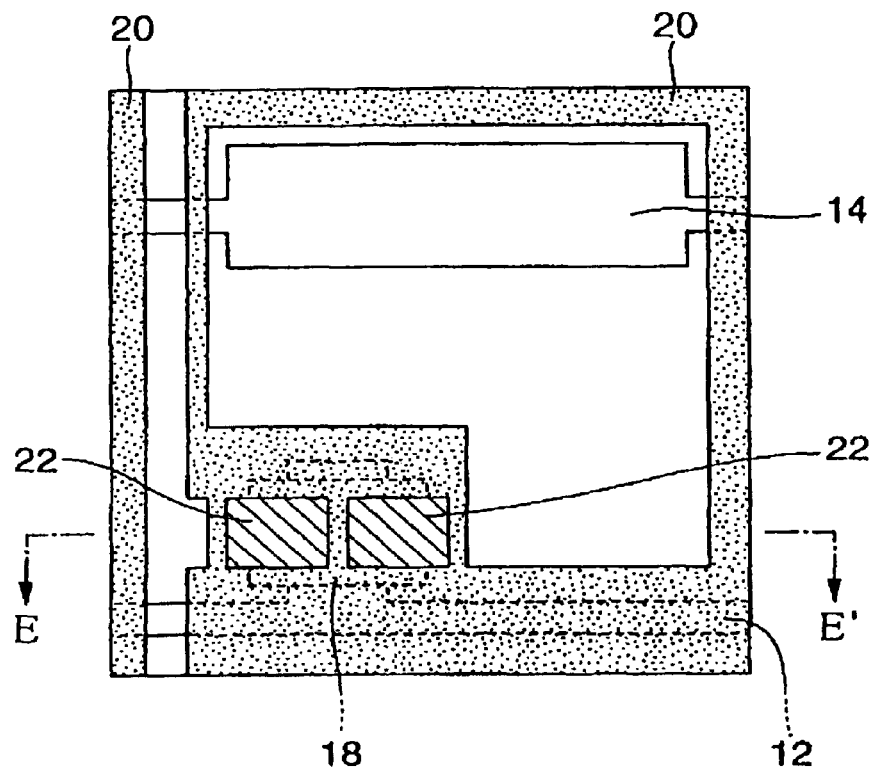
FIGS. 7a and 7b are views illustrating a manufacturing method according to an embodiment of the present invention.
Figure 7:
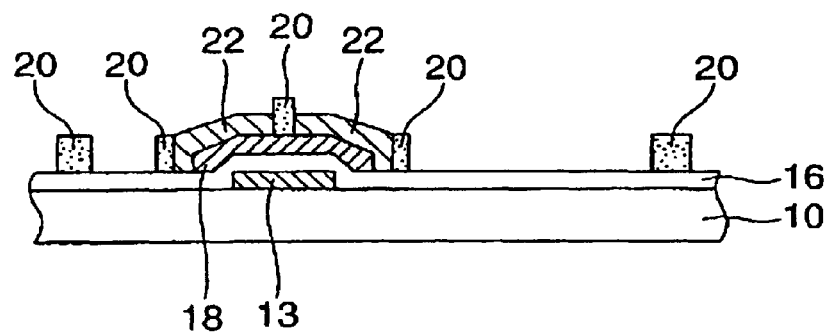

FIG. 7 illustrates the process for forming the source/drain regions. FIG. 7(a) is a plan view of the glass substrate 10 seen from the upper side and FIG. 7(b) is a cross-sectional view taken along a line E–E' shown in FIG. 7(a).

As shown in FIG. 7, the source/drain regions 22 made of the amorphous silicon film into which dopants that have been heavily doped are formed in the openings a3, a4 (see FIG. 6) provided in the polyimide film 20. In this embodiment, the source/drain regions 22 are formed by means of the droplet ejection method.

Specifically, first, a solution containing a silicon compound of which materials containing a Group V element of phosphorus etc. or a Group III element of boron etc. is doped as a dopant source, or a solution containing a silicon compound denatured in elements (phosphorus, boron etc.) thereof and a silicon compound not denatured is ejected from the droplet ejecting head to fill in the openings a3, a4. Hereinafter, the solution containing such silicon compound is referred to as "a silicon solution".

Next, the silicon solution filled in the respective openings a3, a4 is dried and then baked at a temperature of 300° C. to 400° C. These series of processes are carried out in an atmosphere of inert gas such as nitrogen. By doing so, the source/drain regions 22 made of the amorphous silicon film into which dopants (donor or acceptor) are doped heavily are formed in the openings a3, a4 of which the peripheries are surrounded by the bank made of the polyimide film 20.

Here, it is preferable that silane of a higher order photopolymerized by irradiating ultraviolet rays into something having one or more ring-shaped structures such as cyclopentasilane ($Si_5H_{10}$) etc. is used as the aforementioned silicon compound. In this case, it is more preferable that the silane compound is formed by irradiating the UV rays into the mixture of phosphor compound and boron compound of which it is receiving during the polymerization. Further, the solvent of forming the silicon solution is not specifically limited if it dissolves the silicon compound and it does not react with the compound, but commonly, it is preferable that its vapor pressure is 0.001 to 200 mmHg in room temperature. A specific example of the solvent includes a hydrocarbon group solvent such as benzene or toluene.

Furthermore, it is more preferable that before ejecting the silicon solution from the droplet ejection head, the inside of the openings a3, a4 are made to be lyophilic and the circumferences thereof are made to be lyophobic. The lyophilic and lyophobic processing can be implemented by processing the whole glass substrate 10 with an oxygen plasma in the atmospheric pressure plasma to be lyophilic and subsequently processing it with $CF_4$ plasma so that only the polyimide film 20 becomes lyophobic.

Process for Forming Pixel Electrode

Figure 8:
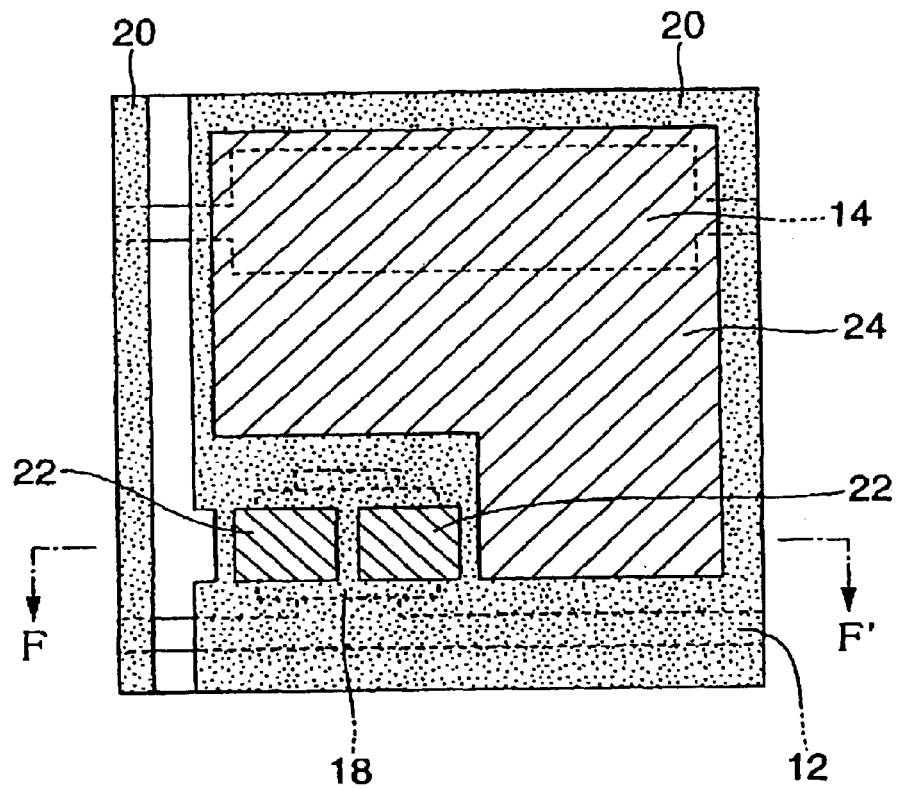
FIGS. 8a and 8b are views illustrating a manufacturing method according to an embodiment of the present invention.
Figure 8:
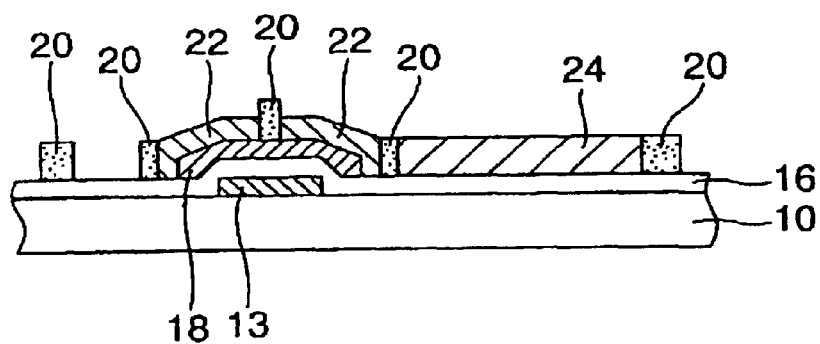

FIG. 8 illustrates the process for forming the pixel electrode. FIG. 8(a) is a plan view of the glass substrate 10 seen from the upper side and FIG. 8(b) is a cross-sectional view taken along a line F–F' shown in FIG. 8(a).

As shown in FIG. 8, the pixel electrode 24 made of an ITO (Indium Tin Oxide) film is formed within the opening a1 (see FIG. 6) provided in the polyimide film 20. In this embodiment, the pixel electrode 24 is also formed by using the droplet ejection method. Specifically, the ITO solution is ejected from the droplet ejection head to fill in the opening a1 and then the dry processing and the thermal treatment are carried out. Thereby, the pixel electrode 24 is formed within the opening a1 of which the periphery is surrounded with the bank made of the polyimide film 20.

For example, by filling in the opening a1 with the typical ITO solution, drying it in an air atmosphere at 160° C. for 5 minutes and then carrying out the thermal treatment in the air atmosphere at 400° C. for 60 minutes, the pixel electrode 24 having a thickness of about 1500 Å can be formed.

Process for Forming Data Line

Figure 9:
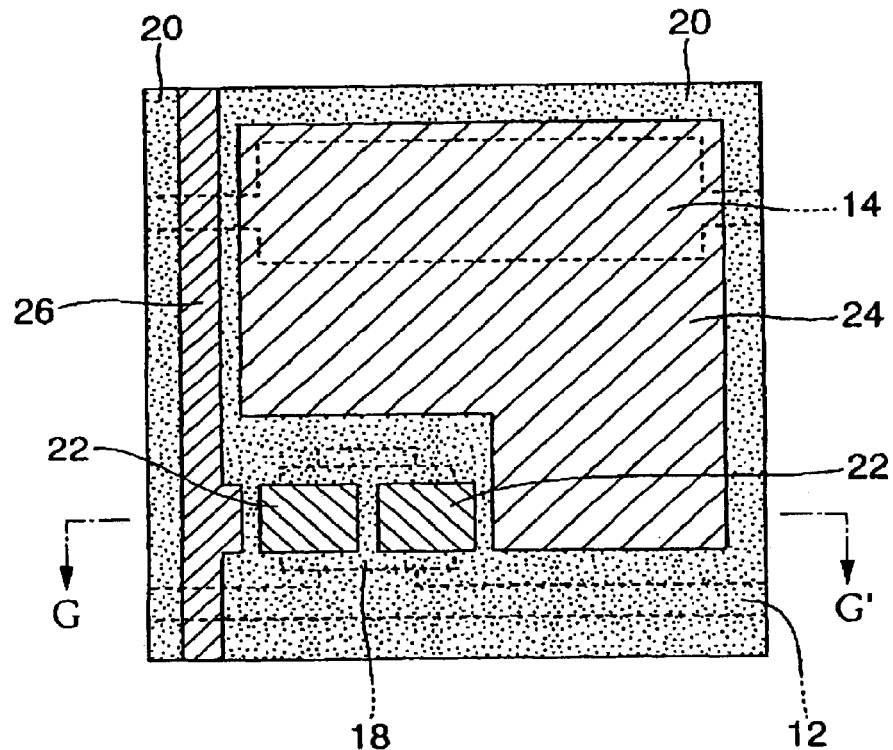
FIGS. 9a and 9b are views illustrating a manufacturing method according to an embodiment of the present invention.
Figure 9:
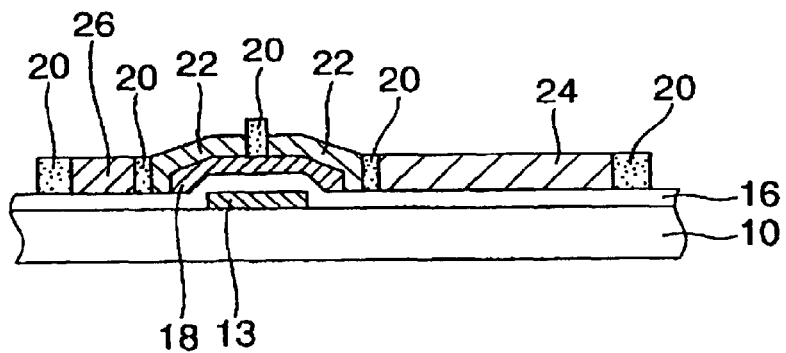

FIG. 9 illustrates the process for forming the data line. FIG. 9(a) is a plan view of the glass substrate 10 seen from the upper side and FIG. 9(b) is a cross-sectional view taken along a line G–G' shown in FIG. 9(a).

As shown in FIG. 9, the data line 26 is formed within the opening a2 (see FIG. 6) provided in the polyimide wall 20. In this embodiment, the data line 26 is also formed by using the droplet ejection method. Specifically, a solution formed by dispersing the metal ultra fine particles similar to those used in the formation of the aforementioned gate line 12 etc. into an organic solvent is ejected from the droplet ejection head to fill in the opening a2, and then the dry processing and the thermal treatment are carried out. Thereby, the data line 26 is formed within the opening a2 of which the periphery is surrounded with the bank made of the polyimide film 20.

Furthermore, the connecting portion. 28 for accomplishing the electrical connections between the source/drain regions 22 and the pixel electrode 24 and the electrical connections between the source/drain regions 22 and the data line 26 is formed. The connecting portion 28 can be also formed similar to the data line 26. Thereby, the thin film transistor T of this embodiment shown in FIG. 3 and the pixel portion 100 including it are completed. Furthermore, a protective film made of silicon oxide film etc. may be formed on the upper surface of the pixel portion 100 as needed.

Furthermore, the process for forming pixel electrode and the process for forming data line can be partly incorporated. In this case, it is preferable that after the applying ITO solution is filled within the opening a1, the solution formed by dispersing the metal ultra fine particles into an organic solvent is filled within the opening a2 before the dry process and the thermal treatment, and then the dry processing and the thermal treatment for the ITO solution and the metal solution are simultaneously carried out.

As described above, in the manufacturing method of this embodiment, by forming the polyimide film 20 which surrounds regions for some elements (source/drain regions 22, pixel electrode 24, and data line 26) constituting a pixel portion with the wall and applying the liquid material to the regions surrounded by the wall made of the polyimide film 20 to form the films, some elements constituting the pixel portion are formed. Thereby, the number of execution steps of the conventional process for film formation combining the vapor phase deposition method such as the CVD method or the sputtering method and the photolithography method can be reduced to simplify the manufacturing time. Furthermore, since the wall (bank) made of the polyimide film 20 is provided, it is possible to minimize the range to which the liquid material is applied and as a result, the utilization efficiency of raw material can be increase. Furthermore, since the number of etching processes are reduced, it is possible to reduce the amount of waste. Therefore, it is possible to reduce the manufacturing cost.

But, although in the aforementioned embodiments, the amorphous silicon film to be the channel region 18 of the thin film transistor T has been formed by using the vapor phase deposition method such as the PECVD method, it may be formed by using the droplet ejection method.

Figure 10:
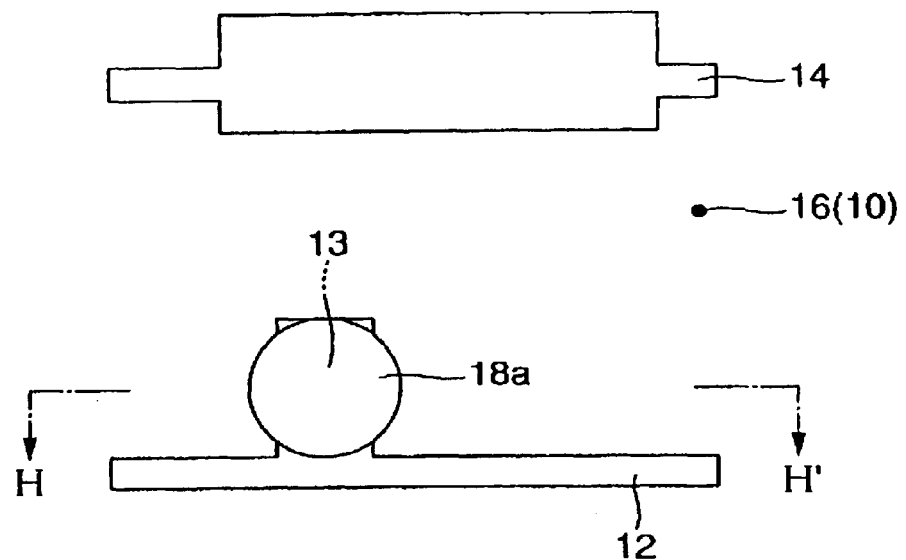
FIGS. 10a and 10b are views illustrating the process for forming the amorphous silicon film by using the droplet ejection method.
Figure 10:
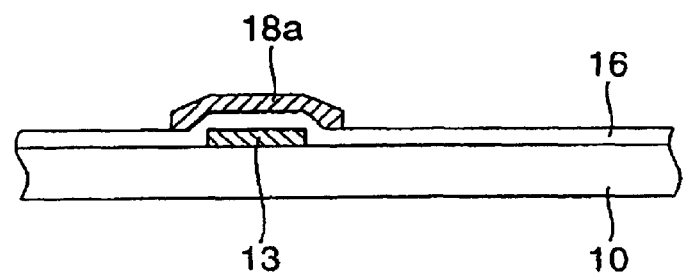

FIG. 10 illustrates the process for forming the amorphous silicon film by using the droplet ejection method, FIG. 10(a) is a plan view of the glass substrate 10 seen from the upper side and FIG. 10(b) is a cross-sectional view taken along a line H-H' shown in FIG. 10(a).

First, similarly to the aforementioned embodiments, the gate insulating film 16 is formed on the whole upper surface of the glass substrate 10 to cover the gate line 12, the gate electrode 13 and the capacitor line 14, respectively (see FIG. 5). Next, the glass substrate 10 on which the gate insulating film 16 has been formed is introduced into nitrogen atmosphere.

Next, by using the droplet ejection head, the silicon solution (solution containing silicon compound) is ejected to a range where the channel region is to be formed. It is preferable that the silicon solution contains the same silicon compound as used in the formation of the aforementioned source/drain regions but does not contains the dopant source made of the Group V element of phosphorus etc. or the Group III element of boron etc.

Thereafter, by drying the ejected silicon solution and baking it at a temperature of about 300° C. to 400° C. the channel region 18a having a island shape made of the amorphous silicon is formed at a predetermined position on the gate electrode 13 as shown in FIG. 10. Since the channel region 18a has a relatively low accuracy in measurement, even if the silicon solution ejected by the droplet ejection method is rather diffused, it does not matter. Furthermore, when the diffusion of liquid exceeds the allowable range, it is possible to suppress the diffusion of the silicon solution, by making the whole surface of the substrate be lyophobic, or by making it be lyophilic only the range where the channel region 18a is to be formed and making the other range be lyophobic.

Figure 11:
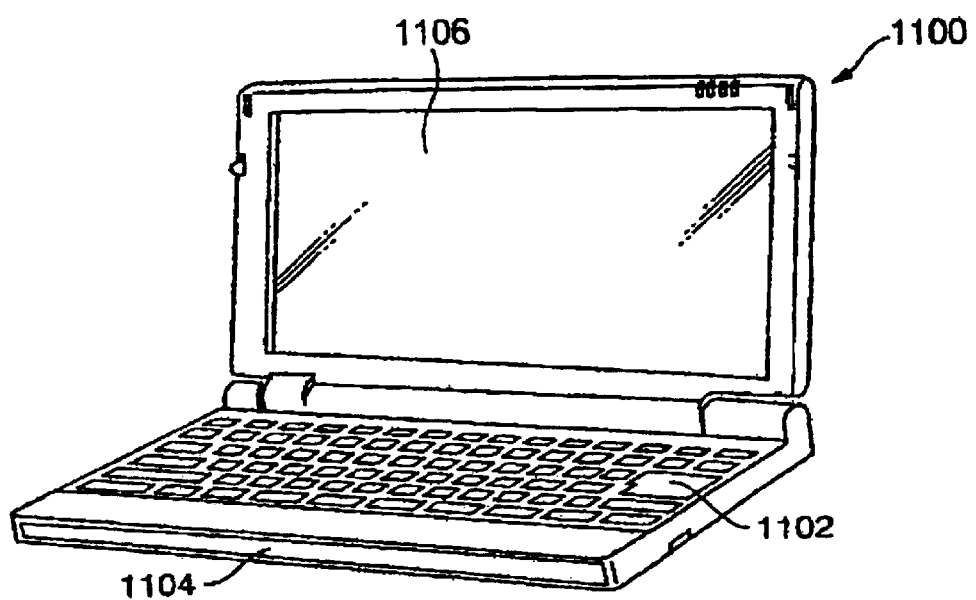
FIG. 11 is a perspective view illustrating an example that the liquid crystal display device applies to a mobile personal computer (information processing apparatus).

Next, an electronic apparatus including the liquid crystal display device according to the aforementioned embodiments will be described. FIG. 11 is a perspective view illustrating an example that the liquid crystal display device according to this embodiment applies to a mobile personal computer (information processing apparatus). In FIG. 11, the personal computer 1100 comprises a main body 1104 including a keyboard 1102 and a liquid crystal display device 1106 according to this embodiment. The manufacturing method according to this embodiment is specifically suitable for manufacturing the liquid crystal display device of which the screen size is large as shown in FIG. 11.

Furthermore, the electronic apparatus comprising the liquid crystal display device of this embodiment may include, in addition to the personal computer shown in FIG. 11, various electronic apparatuses such as a digital still camera, an electronic book, an electronic paper, a liquid crystal television, a view finder type or monitor direct vision-type videotape recorder, a car navigation apparatus, a pager, a notebook, a calculator, a word processor, a work station, a television phone, a POS terminal, an apparatus including a touch panel and the like.

Furthermore, the present invention is not limited to the aforementioned description but applied to various devices comprising a thin film device such as a thin film transistor, an electro-optical device (for example, an organic electroluminescent display device, etc.) comprising the aforementioned device, and an electronic apparatus comprising the aforementioned electro-optical device.

EFFECTS OF THE INVENTION

As described above, according to the present invention, the execution steps of the conventional process combining the vapor phase deposition method and the photolithography method can be reduced and thus the manufacturing time can be reduced. Furthermore, since the partition wall is provided, it is possible to minimize the range to which the liquid material is applied and as a result, the utilization efficiency of raw material is good. Furthermore, since the number of etching processes are reduced, it is possible to reduce the amount of waste. Therefore, it is possible to reduce the manufacturing cost. Therefore, it is possible to reduce the manufacturing cost of device and it is possible to reduce the cost of the device.

The entire disclosure of Japanese Patent Application No. 2002-119965 filed Apr. 22, 2002 is incorporated by reference.

What is claimed is:

1. A method of manufacturing a device having a transistor comprising:
    forming a gate electrode of the transistor on a substrate;
    forming a gate insulating film over the gate electrode;
    forming a semiconductor film over the gate insulating film;
    forming a first partition wall on the semiconductor film to separate a first and a second region;
    forming a first film by depositing a first liquid material in the first region; and
    forming a second film by depositing a second liquid material in the second region.

2. The method of manufacturing a device according to claim 1, wherein at least one of the first film and the second film being formed of a doped silicon film, the doped silicon film being formed at least one of the first liquid material and the second liquid material including a silicon compound and a dopant source.

3. The method of manufacturing a device according to claim 2, further comprising:
    forming a wiring and a second partition wall, the second partition wall being formed between the first film and the wiring; and
    forming a first connecting portion, the first connecting portion accomplishing electrical connection between the first region and the wiring, the first connecting portion covering the second partition wall.

4. The method of manufacturing a device according to claim 3, wherein the wiring being a data line, the data line supplying a signal to the first film via the first connecting portion.

5. The method of manufacturing a device according to claim 2, further comprising:
    forming a functional film and a third partition wall, the third partition wall being formed between the second film and the functional film; and
    forming a second connecting portion, the second connecting portion accomplishing electrical connection between the second region and the functional film, the second connecting portion covering the second partition wall.

6. The method of manufacturing a device according to claim 5, wherein the functional film being a pixel electrode, the pixel electrode applying voltage to an electro-optical layer of the device.

7. The method of manufacturing a device according to claim 1, wherein at least one of the first film and the second film being formed of a conductive film, the conductive film being formed at least one of the first liquid material and the second liquid material including a conductive fine particle.

8. The method of manufacturing a device according to claim 7, wherein the conductive fine particle being a metal fine particle, the metal fine particle containing at least one element selected from gold, silver, copper, palladium, and nickel.

9. The method of manufacturing a device according to claim 1, wherein at least one of the first film and the second film being formed by ejecting a droplet.

10. The method of manufacturing a device according to claim 1, wherein the semiconductor film being formed by ejecting a third liquid material, the third liquid material including a silicon compound.

11. The method of manufacturing a device according to claim 1, further comprising:
    making a surface of the first partition wall to be lyophobic with respect to the first liquidmaterial and the second liquid material before depositing them.

* * * * *

UNITED STATES PATENT AND TRADEMARK OFFICE
CERTIFICATE OF CORRECTION

PATENT NO. : 6,908,796 B2  
APPLICATION NO. : 10/420540  
DATED : June 21, 2005  
INVENTOR(S) : Masahiro Furusawa Page 1 of 1

It is certified that error appears in the above-identified patent and that said Letters Patent is hereby corrected as shown below:

<u>Title page,</u>  
Item [57], ABSTRACT,  
Line 11, "provide" should be -- provided --.

<u>Column 4,</u>  
Line 25, "an" should be -- a --.

<u>Column 11,</u>  
Line 56, "increase" should be -- increased --.

<u>Column 12,</u>  
Line 16, "contains" should be -- contain --.  
Line 21, "a" should be -- an --.

<u>Column 14,</u>  
Line 39, "liquidmaterial" should be -- liquid material --.

Signed and Sealed this

Twentieth Day of June, 2006

JON W. DUDAS  
*Director of the United States Patent and Trademark Office*